(12) United States Patent
Gunji et al.

(10) Patent No.: US 8,562,751 B2
(45) Date of Patent: Oct. 22, 2013

(54) DRY CLEANING METHOD OF SUBSTRATE PROCESSING APPARATUS

(75) Inventors: Isao Gunji, Nirasaki (JP); Yusaku Izawa, Nirasaki (JP); Hitoshi Itoh, Nirasaki (JP); Tomonori Umezaki, Ube (JP); Yuta Takeda, Ube (JP); Isamu Mori, Chiyoda-ku (JP)

(73) Assignees: Tokyo Electron Limited, Tokyo (JP); Central Glass Company, Limited, Ube-shi (JP)

( * ) Notice: Subject to any disclaimer, the term of this patent is extended or adjusted under 35 U.S.C. 154(b) by 0 days.

(21) Appl. No.: 13/351,641

(22) Filed: Jan. 17, 2012

(65) Prior Publication Data

US 2012/0180811 A1    Jul. 19, 2012

(30) Foreign Application Priority Data

Jan. 18, 2011    (JP) ................. 2011-007473

(51) Int. Cl.
*C23G 1/00* (2006.01)
(52) U.S. Cl.
USPC ............... 134/2; 148/276; 148/277; 148/284; 148/285; 148/286; 148/287; 438/905; 134/1; 134/1.1; 134/21; 134/22.1; 134/22.12; 134/22.14; 134/22.18; 134/22.19; 134/26; 134/30; 134/34; 134/35; 134/36; 134/37; 134/42
(58) Field of Classification Search
USPC ................. 148/276, 277, 284, 285, 286, 287; 438/905; 134/1, 1.1, 2, 21, 22.1, 22.12, 134/22.14, 22.18, 22.19, 26, 30, 34, 35, 36, 134/37, 42
See application file for complete search history.

(56) References Cited

U.S. PATENT DOCUMENTS

| 5,221,366 A * | 6/1993 | Roberts et al. ................. 148/22 |
| 5,993,679 A | 11/1999 | Koide et al. |
| 2005/0139234 A1* | 6/2005 | Dobashi et al. ................. 134/19 |

FOREIGN PATENT DOCUMENTS

| JP | 4049423 | 12/2007 |
| KR | 2000-0016868 A | 3/2000 |
| KR | 2002-0056342 A | 7/2002 |
| KR | 10-2005-0013668 A | 2/2005 |

OTHER PUBLICATIONS

M. A. George, et al., "Reaction of 1,1,1,5,5,5-Hexafluoro-2,4-pentanedione ($H^+$hfac) with CuO, $Cu_2O$, Cu Films", J. Electrochem. Soc., vol. 142, No. 3, Mar. 1995, pp. 961-965.
H. L. Nigg et al., "Surface Reaction Pathways of 1,1,1,5,5,5-hexafluoro-2,4-pentanedione on clean and Pre-oxidized Ni(110) Surfaces", Journal of Vacuum Science and Technology, Part A, AVS/AIP, Melville, NY, USA, vol. 17, No. 6, Nov. 1, 1999, pp. 3477-3480.

* cited by examiner

*Primary Examiner* — Bibi Carrillo
(74) *Attorney, Agent, or Firm* — Oblon, Spivak, McClelland, Maier & Neustadt, L.L.P.

(57) ABSTRACT

A dry cleaning method of a substrate processing apparatus includes forming a metal oxide by oxidizing a metal film adhered to the inside of a processing chamber of the substrate processing apparatus; forming a complex by reacting the metal oxide with β-diketone; and sublimating the complex to be removed. A cleaning gas containing oxygen and β-diketone is supplied into the processing chamber while heating the inside of the processing chamber. A flow rate ratio of oxygen to β-diketone in the cleaning gas is set such that a formation rate of the metal oxide is lower than a formation rate of the complex.

19 Claims, 7 Drawing Sheets

TIME
PRE-CONDITIONING

TIME
REFRESHING

US 8,562,751 B2

DRY CLEANING METHOD OF SUBSTRATE PROCESSING APPARATUS

CROSS-REFERENCE TO RELATED APPLICATIONS

This application claims priority to Japanese Patent Application No. 2011-007473 filed on Jan. 18, 2011, the entire contents of which are incorporated herein by reference.

FIELD OF THE INVENTION

The present invention relates to a dry cleaning method of a substrate processing apparatus.

BACKGROUND OF THE INVENTION

In a semiconductor device manufacturing process, there is known a method for performing a dry cleaning process on a metal film adhered to the inside of a processing chamber of a substrate processing apparatus such as a film forming apparatus or the like. Among metals, a halogenated compound such as Ni (nickel), Co (cobalt), Cu (copper), Ru (ruthenium) or the like has a very low vapor pressure unlike W (tungsten), Ti (titanium), Ta (tantalum) or the like. Therefore, a dry etching employing a conventional etching gas such as $ClF_3$ or the like is performed at a high temperature. As for a method for removing such metal at a low temperature, there is known a method including the steps of: oxidizing a target metal with $O_2$ (oxygen); forming a metal complex by reacting the metal oxide with β-diketone such as hexafluoroacetylacetone (Hhfac) or the like; and sublimating the metal complex to be exhausted (see, e.g., Japanese Patent No. 4049423, and J. Electrochem. Soc., Vol. 142, No. 3, P961 (1995)).

The present inventors have studied the dry cleaning method including the steps of: oxidizing a target metal with $O_2$; forming a metal compound by reacting the oxidized metal with β-diketone such as hexafluoroacetylacetone or the like; and removing the metal compound by sublimation. As a result, the present inventors have found that this method has the following drawbacks.

Specifically, in the above method, the excessive oxidation of the metal leads to abrupt decrease of the reactivity with hexafluoroacetylacetone, so that the etching reaction may be stopped. Therefore, the efficiency of dry cleaning is decreased, or the dry cleaning may not be performed. Such phenomenon is especially prominent when the metal is Ni (nickel).

SUMMARY OF THE INVENTION

In view of the above, the present invention provides a dry cleaning method of a substrate processing apparatus which can perform dry cleaning effectively compared to a conventional method.

In accordance with one aspect of the present invention, there is provided a dry cleaning method of a substrate processing apparatus including: forming a metal oxide by oxidizing a metal film adhered to the inside of a processing chamber of the substrate processing apparatus; forming a complex by reacting the metal oxide with β-diketone; and sublimating the complex to be removed. A cleaning gas containing oxygen and β-diketone is supplied into the processing chamber while heating the inside of the processing chamber. A flow rate ratio of oxygen to β-diketone in the cleaning gas is set such that a formation rate of the metal oxide is lower than a formation rate of the complex.

In accordance with another aspect of the present invention, there is provided a dry cleaning method of a substrate processing apparatus, including: forming a nickel oxide by oxidizing a nickel film adhered to the inside of a processing chamber of the substrate processing apparatus; forming a complex by reacting the nickel oxide with β-diketone; and sublimating the complex to be removed, wherein a cleaning gas containing oxygen and β-diketone is supplied into the processing chamber while heating the inside of the processing chamber, and a flow rate ratio of oxygen to β-diketone in the cleaning gas is set such that a formation rate of the nickel oxide is lower than a formation rate of the complex.

BRIEF DESCRIPTION OF THE DRAWINGS

The above and other objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described in detail with reference to the accompanying drawings which form a part hereof.

Figure 1:
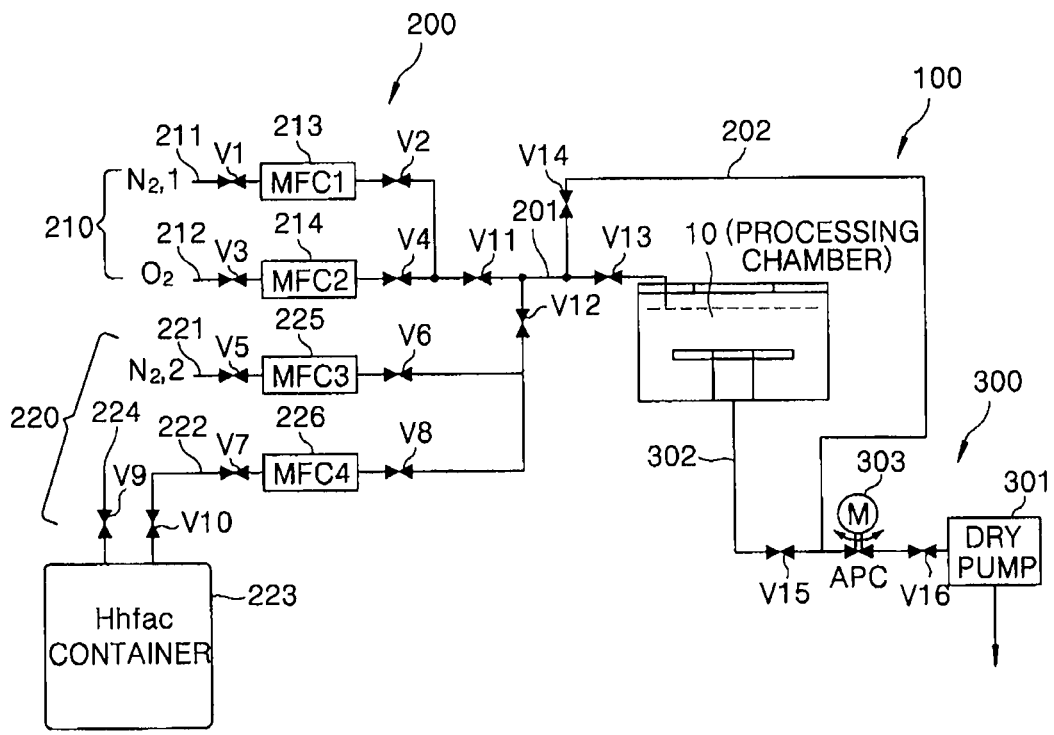
FIG. 1 shows an entire configuration of a CVD apparatus in accordance with an embodiment of the present invention.
Figure 2:
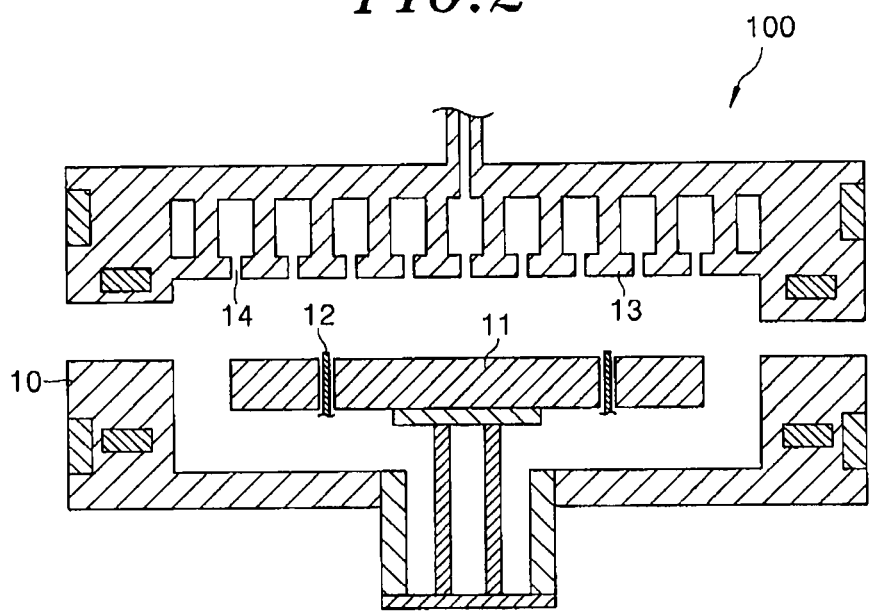
FIG. 2 shows a schematic configuration of a processing chamber of the CVD apparatus shown in FIG. 1.

FIGS. 1 and 2 show a configuration example of a CVD apparatus as a substrate processing apparatus for performing a dry cleaning method in accordance with an embodiment of the present invention. FIG. 1 shows an entire schematic configuration of a CVD apparatus 100, and FIG. 2 shows a schematic configuration of a processing chamber 10. As shown in FIGS. 1 and 2, the CVD apparatus 100 includes a substantially cylindrical airtight processing chamber 10.

As shown in FIG. 1, the processing chamber 10 is connected to a gas supply unit 200 for supplying a cleaning gas, and a gas exhaust unit 300. The gas supply unit 200 has an oxygen gas supply system 210 and a Hhfac (hexafluoroacetylacetone) supply system 220.

The oxygen gas supply system 210 has a first nitrogen supply line 211 connected to a nitrogen gas supply source and an oxygen supply line 212 connected to an oxygen gas supply source. A mass flow controller (MFC1) 213 is installed in the first nitrogen supply line 211, and a mass flow controller (MFC2) 214 is installed in the oxygen supply line 212. Valves V1 and V2 are installed at an upstream side and a downstream side of the mass flow controller (MFC1) 213, and valves V3 and V4 are installed at an upstream side and a downstream side of the mass flow controller (MFC2) 214. The first nitrogen supply line 211 and the oxygen supply line 212 are joined and connected to a main line 201. A valve V11 is installed at the downstream side of the junction of the first nitrogen supply line 211 and the oxygen supply line 212.

The Hhfac supply system 220 has a second nitrogen supply line 221 connected to a nitrogen gas supply source and a Hhfac supply line 222 connected to a Hhfac container 223. A mass flow controller (MFC3) 225 is installed in the second nitrogen supply line 221, and a mass flow controller (MFC4) 226 is installed in the Hhfac supply line 222. Valves V5 and V6 are installed at an upstream side and a downstream side of the mass flow controller (MFC3) 225, and valves V7 and V8 are installed at an upstream side and a downstream side of the mass flow controller (MFC4) 226. The second nitrogen supply line 221 and the Hhfac supply line 222 are joined and connected to a main line 201. A valve V12 is installed at the downstream side of the junction of the second nitrogen supply line 221 and the Hhfac supply line 222. Further, the Hhfac container 223 is connected to a carrier gas supply line 224 for supplying a carrier gas for bubbling. A valve V9 is installed in the carrier gas supply line 224, and a valve V10 is installed in the Hhfac supply line 222 at the outlet side of the Hhfac container 223.

The main line 201 connected to the oxygen gas supply system 210 and the Hhfac supply system 220 is connected to the processing chamber 10. Further, a bypass line 202 branched from the main line 201 and connected to the gas exhaust unit 300 while bypassing the processing chamber 10 is installed in the main line 201. A valve V13 is installed in the main line 201 at a downstream side of the branch point where the bypass line 202 is branched from the main line 201, and a valve V14 is installed in the bypass line 202.

The gas exhaust unit 300 includes a dry pump 301, and the dry pump 301 is connected to the processing chamber through the gas exhaust line 302. An automatic pressure controller (APC) 303 is installed in the gas exhaust line 302, and valves V15 and V16 are installed at an upstream side and a downstream side of the automatic pressure controller (APC) 303, respectively.

As shown in FIG. 2, a stage 11 for mounting thereon a semiconductor wafer as a substrate to be processed is provided in the processing chamber 10. The stage 11 has a heater (not shown) for heating the semiconductor wafer to a predetermined temperature. Further, the stage 11 has lift pins 12 that are vertically moved by a driving mechanism (not shown) so as to project and retract with respect to the stage 11. When the semiconductor wafer is loaded and unloaded on the stage 11, the semiconductor wafer is temporarily supported above the stage 11 by the lift pins 12.

A shower head 13 is provided at a ceiling portion of the processing chamber 10 so as to face the stage 11 with a gap therebetween. A plurality of gas injection holes 14 is formed in the shower head 13, and a predetermined processing gas is supplied toward the semiconductor wafer on the stage 11 through the gas injection holes 14. A cleaning gas is also supplied into the processing chamber 10 through the gas injection holes 14 of the shower head 13. The processing chamber 10 is connected to the gas exhaust unit 300 shown in FIG. 1.

In the CVD apparatus 100 configured as described above, the semiconductor wafer is mounted on the stage 11 and heated to a predetermined temperature, and a predetermined processing gas is supplied to the semiconductor wafer through the gas injection holes 14 of the shower head 13, thereby forming a specific film, e.g., a metal film such as Ni (nickel), Co (cobalt), Cu (copper), Ru (ruthenium) or the like, on the semiconductor wafer by CVD. When film deposition is performed on the semiconductor wafer, a metal film or the like is deposited on components of the processing chamber 10. When the deposit remains, the reflectivity is changed and, thus, the film formation state is changed. Or, the deposit may be peeled off and adhered to the semiconductor wafer.

Thus, in the CVD apparatus 100, cleaning for removing the deposit in the processing chamber 10 is regularly performed. A cleaning method includes a wet cleaning method for performing cleaning using liquid while opening the processing chamber 10 to the atmosphere, and a dry cleaning method for performing cleaning using a cleaning gas without opening the processing chamber 10 to the atmosphere. Since the dry cleaning method can be performed without opening the processing chamber 10 to the atmosphere, a down time during which the apparatus cannot be used can be considerably reduced compared to the wet cleaning method.

In the present embodiment, a gas containing oxygen and β-diketone is used as a cleaning gas in a cleaning process for removing deposit in the processing chamber 10. For example, hexafluoroacetylacetone (Hhfac) in which an alkyl group coupled to a carbonyl group contains a halogen atom can be preferably used as β-diketone. The β-diketone is preferably used because an inductive effect of the halogen atom leads to decrease of an electron density of an oxygen atom in the carbonyl group and allows the hydrogen atom coupled to the oxygen atom to be easily dissociated as a hydrogen ion. As the dissociation easily occurs, the reactivity is increased.

Hereinafter, the case of using a gas containing oxygen and hexafluoroacetylacetone as a cleaning gas will be described. In order to clean the processing chamber 10, the processing chamber 10 is heated to a predetermined temperature (about 200° C. to 400° C.) by the heater in the stage 11 and the processing chamber 10 is exhausted to a predetermined depressurized atmosphere (e.g., 13300 Pa (100 Torr)). Further, the cleaning gas is supplied at a predetermined flow rate.

Accordingly, the metal film is removed by performing the steps of: forming a metal oxide by oxidizing a metal film with oxygen; forming a complex by reacting the metal oxide with hexafluoroacetylacetone; and sublimating the complex. At this time, the flow rate ratio of oxygen to hexafluoroacetylacetone in the cleaning gas is set such that the formation rate of the metal oxide does not exceed the formation rate of the complex. The reason thereof is described in the following.

Figure 3:
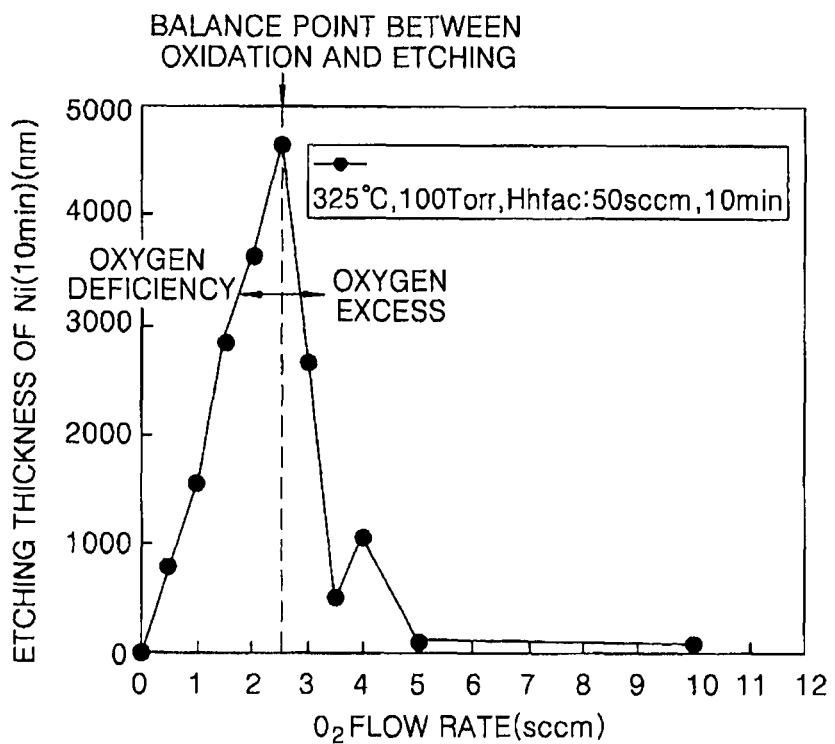
FIG. 3 is a graph showing relationship between an etching thickness of Ni and an oxygen flow rate.

The graph of FIG. 3 shows an etching thickness in the case of etching Ni with the cleaning gas for about 10 minutes while varying a flow rate of oxygen. In the graph of FIG. 3, the vertical axis represents an etching thickness (nm) of Ni, and the horizontal axis represents a flow rate (sccm) of $O_2$. The etching conditions were set as follows: a temperature was about 325° C.; a pressure was about 13300 Pa (100 Torr); a cleaning gas was supplied such that a flow rate of $O_2$ was changed between about 0 sccm and 10 sccm while fixing a flow rate of hexafluoroacetylacetone to about sccm and a total flow rate of nitrogen and oxygen to about 50 sccm.

When the flow rate of oxygen was zero, a Ni material was not etched. When $O_2$ was added at a flow rate of 0.5 sccm, the Ni material was etched. The etching amount of the Ni material was increased in a substantially linear manner until the flow rate of oxygen reached 2.5 sccm. However, when the flow rate of oxygen exceeded 2.5 sccm, the etching amount of the Ni material was abruptly decreased. When the flow rate of oxygen exceeded 5.0 sccm, the etching amount of the nickel material became substantially zero.

This result shows that although oxygen is needed to etch the Ni material, the Ni material is not etched when oxygen is excessively supplied. The reason thereof is assumed as followings. When oxygen is excessively supplied, the surface of Ni is excessively oxidized and the surface of the Ni material is covered with nickel oxide. In that state, the reaction between nickel oxide and hexafluoroacetylacetone does not occur, so that no complex is formed. In other words, in order to allow the reaction between nickel oxide and hexafluoroacetylacetone to proceed, unoxidized Ni is required as a catalyst for the reaction between oxidized Ni and hexafluoroacetylacetone.

The etching proceeds when the flow rate ratio of oxygen to the hexafluoroacetylacetone in the cleaning gas is set such that the formation rate of nickel oxide (metal oxide) generated by oxidation of Ni by oxygen does not exceed the formation rate of a complex generated by reaction between nickel oxide and hexafluoroacetylacetone, i.e., such that the flow rate of $O_2$ is lower than "balance point of oxidation and etching" shown in FIG. 3.

The "balance point between oxidation and etching" shown in FIG. 3 indicates the case in which the flow rate of oxygen is about 2.5 sccm. At this time, the flow rate ratio of oxygen to hexafluoroacetylacetone is about 2.5/50=5%. Since the etching amount becomes maximum at the "balance point between oxidation and etching", the dry cleaning can be effectively performed by selecting the flow rate ratio of oxygen to hexafluoroacetylacetone near the "balance point between oxidation and etching" in the case of performing actual dry cleaning. In the example shown in FIG. 3, the heating temperature is about 325° C. The "balance point between oxidation and etching" is changed depending on the heating temperatures.

Figure 4:
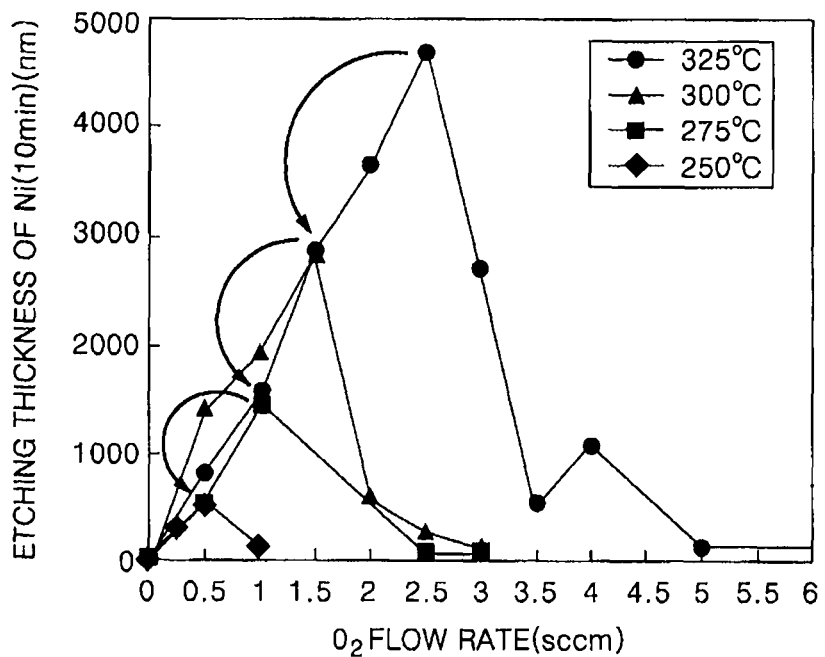
FIG. 4 is a graph showing relationship between an etching thickness of Ni and an oxygen flow rate at different temperatures.

The graph of FIG. 4 shows relationship between a flow rate of oxygen and an etching thickness of Ni at different heating temperatures of about 325° C., 300° C., 275° C. and 250° C. In the graph of FIG. 4, the vertical axis represents an etching thickness of Ni (nm), and the horizontal axis represents a flow rate of oxygen (sccm). As can be seen from the graph of FIG. 4, the flow rate of oxygen which corresponds to the "balance point between oxidation and etching" is shifted to a lower flow rate side as the heating temperature is decreased.

In other words, when the heating temperature is about 300° C., the flow rate of oxygen which corresponds to the "balance point between oxidation and etching" is about 1.5 sccm. In that case, a flow rate ratio of oxygen to hexafluoroacetylacetone is about 1.5/50=3%. When the heating temperature is about 275° C., the flow rate of oxygen which corresponds to the "balance point between oxidation and etching" is about 1.0 sccm. In that case, a flow rate ratio of oxygen to hexafluoroacetylacetone is about 1.0/50=2%. when the heating temperature is about 250° C., the flow rate of oxygen which corresponds to the "balance point between oxidation and etching" is about 0.5 sccm. In that case, a flow rate ratio of oxygen to hexafluoroacetylacetone is about 0.5/50=1%.

In the following, the numerical values of the heating temperature, the flow rate of oxygen which corresponds to the "balance point between oxidation and etching", and the maximum etching rate are shown.

At the temperature of about 325° C., the maximum etching rate is about 464 nm/min, and the optimal flow rate of oxygen is about 2.5 sccm.

At the temperature of about 300° C., the maximum etching rate is about 282 nm/min, and the optimal flow rate of oxygen is about 1.5 sccm.

At the temperature of about 275° C., the maximum etching rate is about 142 nm/min, and the optimal flow rate of oxygen is about 1.0 sccm.

At the temperature of about 250° C., the maximum etching rate is about 50 nm/min, and the optimal flow rate of oxygen is about 0.5 sccm.

Figure 5:
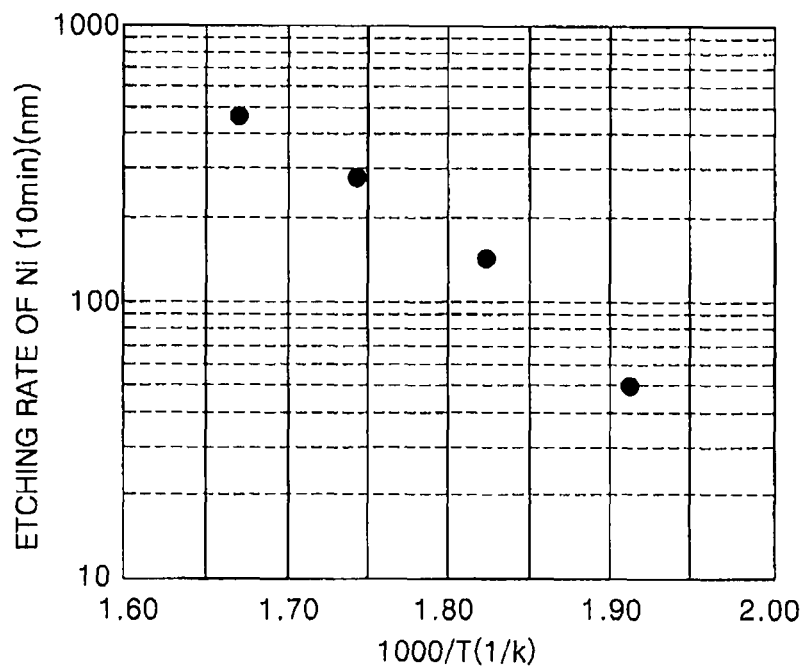
FIG. 5 is a graph showing Arrhenius plots of a maximum etching rate at different heating temperatures.

This result shows that it is preferable to set the heating temperature to be higher than or equal to about 200° C. in order to effectively perform cleaning. Further, it is preferable to set the heating temperature to be lower than or equal to about 400° C. because hexafluoracetylacetone is decomposed when the heating temperature is higher than about 400° C. Accordingly, the heating temperature is preferably set to be in the range from about 200° C. to 400° C. As described above, when the heating temperature ranges from about 250° C. to 325° C., it is preferable to set the flow rate ratio of oxygen to hexafluoroacetylacetone to about 1% to 5%. The graph of FIG. 5 shows Arrhenius plots of the maximum etching rate at the heating temperatures of about 250° C. to 325° C. In the graph of FIG. 5, the vertical axis represents an etching rate of Ni (nm/min), and the horizontal axis represents 1000/T (1/K).

Figure 6:
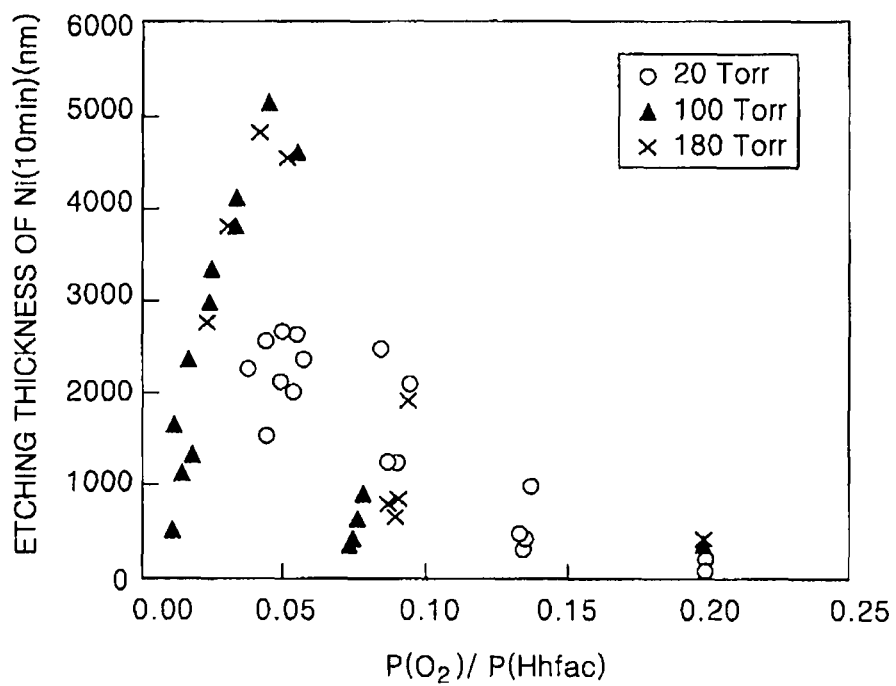
FIG. 6 is a graph showing relationship between an etching thickness of Ni and a partial pressure ratio.
Figure 7:
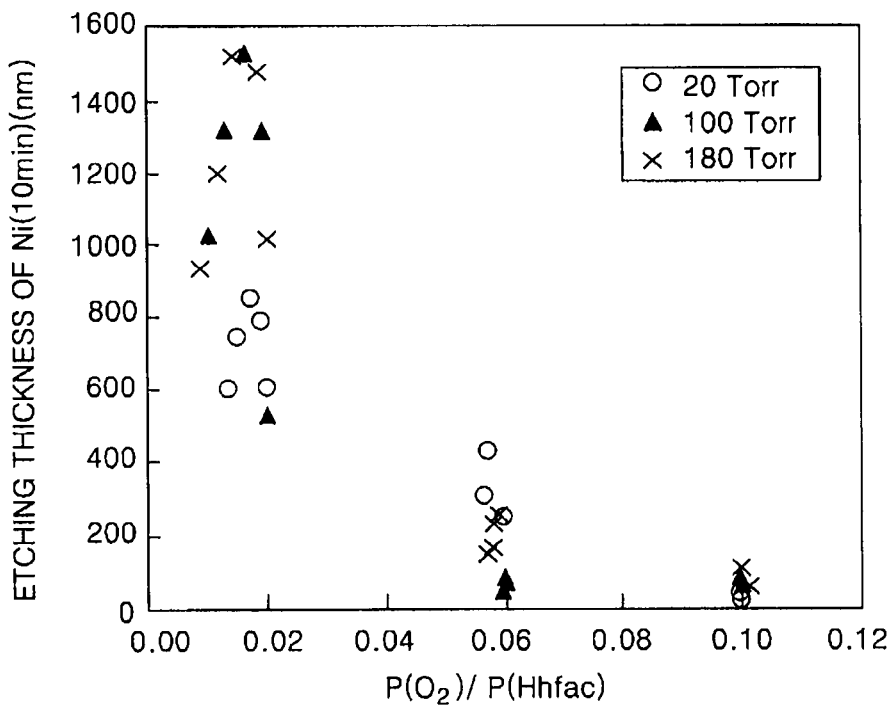
FIG. 7 is a graph showing relationship between an etching thickness of Ni and a partial pressure ratio.

The flow rate ratio of $O_2$ to hexafluoroacetylacetone can be expressed as a partial pressure ratio $P(O_2)/P(Hhfac)$ of a partial pressure of $O_2$ $P(O_2)$ to a partial pressure of hexafluoroacetylacetone $P(Hhfac)$. The graphs of FIGS. 6 and 7 show the total pressure dependence of an etching thickness of Ni (nm) represented in the vertical axis and the partial pressure ratio $P(O_2)/P(Hhfac)$ represented in the horizontal axis represents. FIG. 6 shows the case in which the heating temperature is about 325° C., and FIG. 7 shows the case in which the heating temperature is about 275° C.

In the graphs of FIGS. 6 and 7, "○" plots indicate the case in which a total pressure is about 2660 Pa (20 Torr); "Δ" plots indicate the case in which a total pressure is about 13300 Pa (100 Torr); and "x" plots indicate the case in which a total pressure is about 23940 Pa (180 Torr). As can be seen from the graphs of FIGS. 6 and 7, even if the total pressure is changed, the partial pressure ratios $P(O_2)/P(Hhfac)$ indicating the maximum etching amounts are in the same range. The same tendency is obtained even if the heating temperature is changed.

Figure 8:
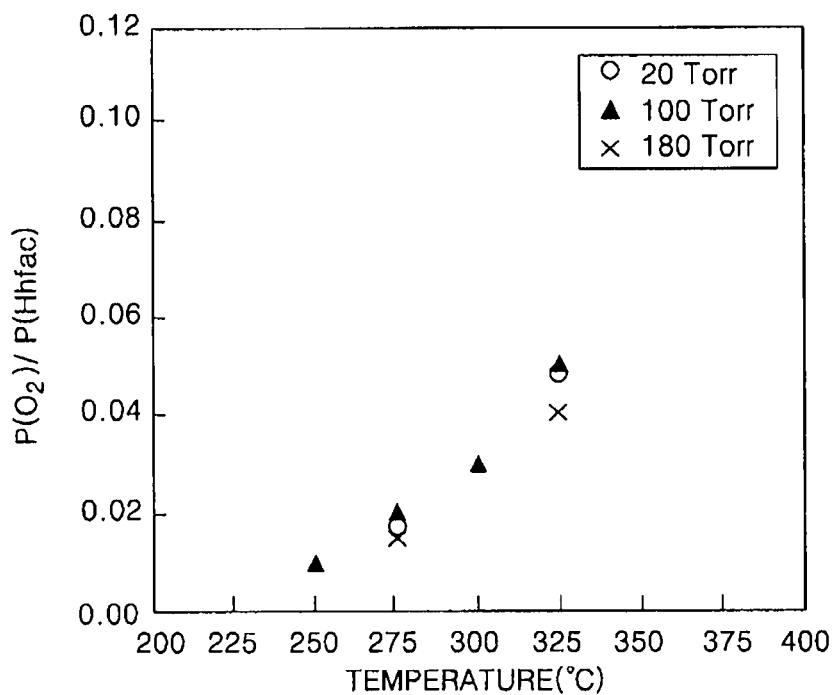
FIG. 8 is a graph showing relationship between a temperature and an optimal partial pressure ratio at different total pressures.

In FIG. 8, the vertical axis and the horizontal axis represent a partial pressure ratio $P(O_2)/P(Hhfac)$ and a temperature, respectively. FIG. 8 plots the optimal partial pressure ratios $P(O_2)/P(Hhfac)$ indicating the maximum etching amounts at different temperatures in the case of setting a total pressure to about 2660 Pa (20 Torr), 13300 Pa (100 Torr) and 23940 Pa (180 Torr). The maximum partial pressure ratios $P(O_2)/P(Hhfac)$ indicating the maximum etching amounts at different heating temperatures are substantially the same regardless of the partial pressure ranging from about 2660 Pa to 23940 Pa.

Figure 9:
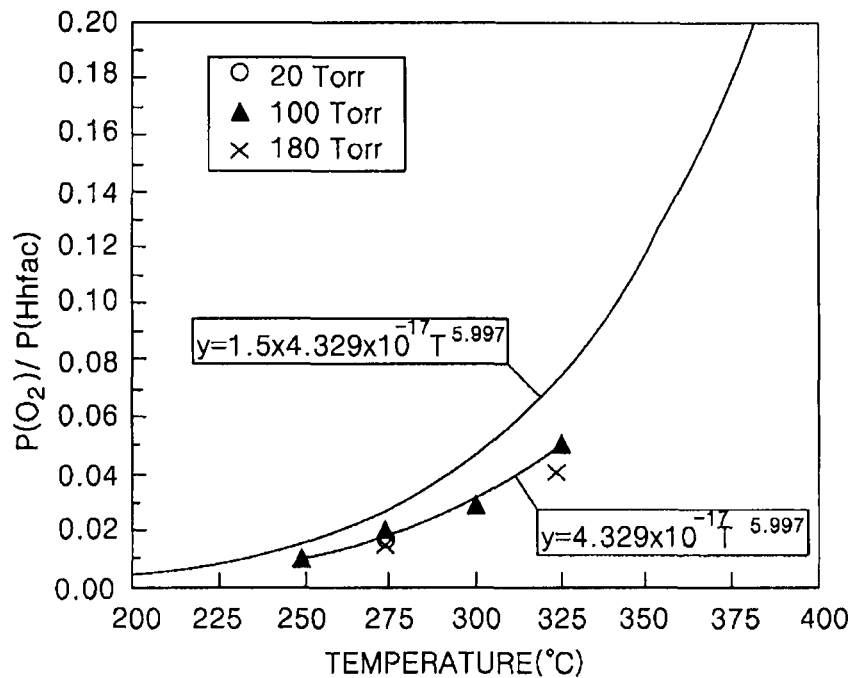
FIG. 9 is a graph showing relationship between an optimal partial pressure ratio and a temperature.

The line shown in FIG. 9 is a partitioning line between the region including the plots of the optimal partial pressure ratios $P(O_2)/P(Hhfac)$ indicating the maximum etching amounts at different temperatures and the region in which higher partial pressure ratios $P(O_2)/P(Hhfac)$ are obtained, i.e., the region in which the amount of oxygen becomes excessive. This line is expressed by $y(P(O_2)/P(Hhfac))=1.5\times 4.329\times 10^{-17}\times T^{5.997}$. Therefore, it is preferable to perform cleaning in the region in which the partial pressure ratio $P(O_2)/P(Hhfac)$ satisfies $P(O_2)/P(Hhfac)\leq 1.5\times 4.329\times 10^{17}\times T^{5.997}$. Accordingly, the cleaning can be effectively performed without stopping the etching.

Figure 10:
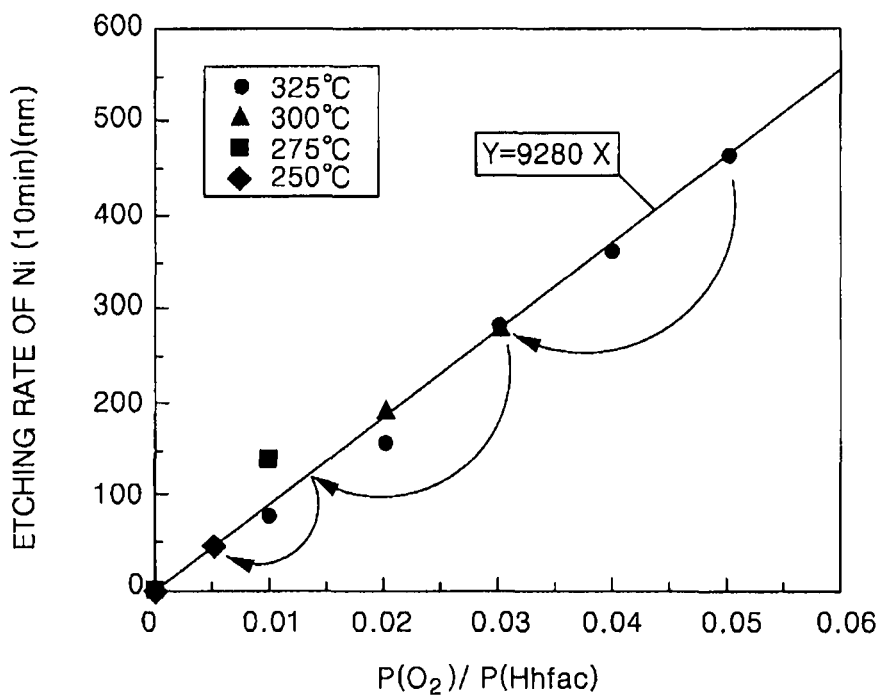
FIG. 10 is a graph showing relationship between an etching rate of Ni and a partial pressure ratio.

FIG. 10 plots relationship between a maximum etching rate and a partial pressure ratio $P(O_2)/P(Hhfac)$ at different temperatures (about 325° C., 300° C., 275° C. and 250° C.). In the graph of FIG. 10, the vertical axis represents an etching rate of Ni (nm/min), and the horizontal axis represents a partial pressure ratio $P(O_2)/P(Hhfac)$. As shown in FIG. 10, the maximum etching rate is in a linear relationship with the partial pressure ratio $P(O_2)/P(Hhfac)$. In that case, the linear line is expressed by Y=9280X.

As described above, the optimal partial pressure ratio $P(O_2)/P(Hhfac)$ indicating the maximum etching amount is changed depending on the heating temperatures. When the heating temperature is low, the maximum partial pressure ratio $P(O_2)/P(Hhfac)$ is decreased. In other words, when the heating temperature is low, the flow rate of oxygen needs to be decreased. Meanwhile, in the CVD apparatus 100 shown in FIG. 2, the temperature of the stage 11 is increased by the heater installed in the stage 11. However, other components in the processing chamber 10 have lower temperatures than the temperature of the stage 11.

Hence, if an optimal partial pressure ratio $P(O_2)/P(Hhfac)$ is determined based on the heating temperature of the stage 11, the components having a low temperature in the processing chamber 10 may not be cleaned by etching due to the excessive amount of oxygen.

Figure 11:
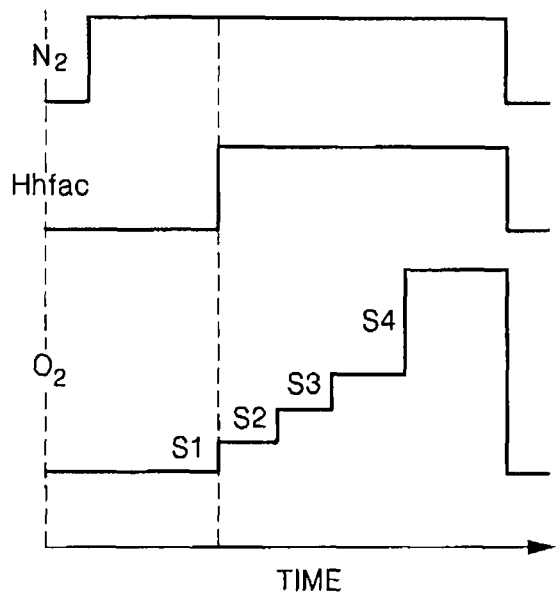
FIG. 11 shows an example of a gas supply process.

To that end, it is preferable to employ a method for performing dry cleaning by gradually increasing a flow rate of oxygen as the process proceeds from S1 to S4 as can be seen from the graph of FIG. 11 which has the vertical axis representing a flow rate and the horizontal axis representing time. This method enables portions having a relatively low temperature in the processing chamber 10 to be dry-cleaned and portions having a relatively high temperature to be more effectively dry-cleaned in a short period of time. In that case, the supply of nitrogen gas is firstly started and, then, the simultaneous supply of hexafluoroacetylacetone and oxygen is started. As the process proceeds from S1 to S4, only the flow rate of oxygen is gradually increased while fixing the flow rate of hexafluoroacetylacetone.

Figure 12:
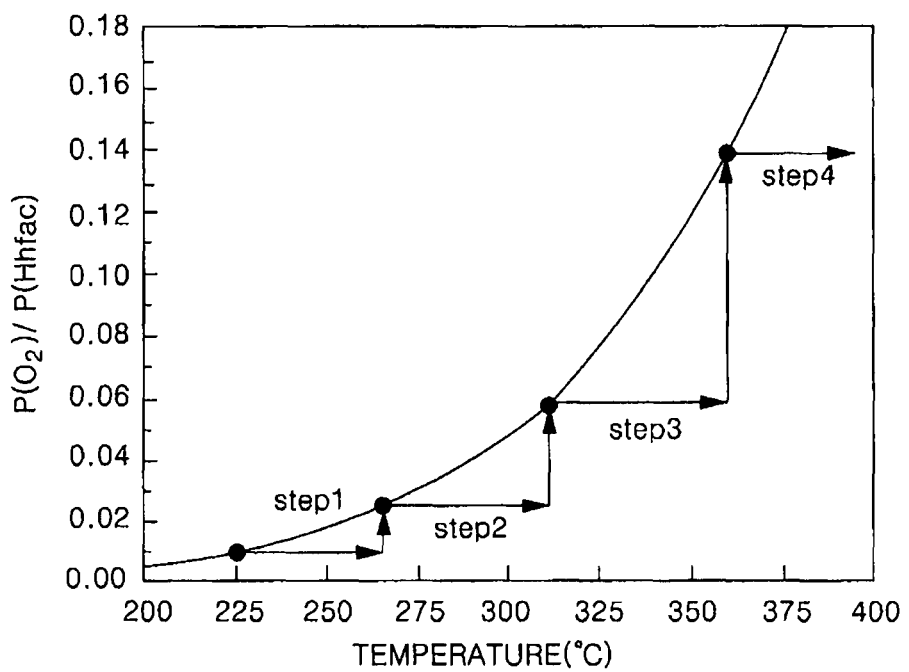
FIG. 12 is a graph showing an example of a flow rate of oxygen gas which is expressed by relationship between a partial pressure ratio and a temperature.

In the graph of FIG. 12 which has the vertical axis representing a partial pressure ratio $P(O_2)/P(Hhfac)$ and the horizontal axis representing a temperature (° C.), an example of a flow rate of $O_2$ in S1 to S4 is expressed as a partial pressure ratio $P(O_2)/P(Hhfac)$. As illustrated in FIG. 12, by gradually increasing the flow rate of $O_2$ such that the partial pressure ratio $(P(O_2)/P(Hhfac))$ becomes lower than the curved line expressed by $y=1.5\times 4.329\times 10^{-17}\times T^{5.997}$ shown in FIG. 9, the portions having a low temperature can be cleaned and the portions having a high temperature can be more effectively cleaned.

When an oxide is excessively produced by oxidation, the supply of oxygen is stopped, and a reduction process may be performed by supplying a reduction gas, e.g., hydrogen gas, ammonia gas or the like while heating the inside of the processing chamber, or by using a remote plasma of hydrogen. After the reduction process is performed as preprocessing (preconditioning), the cleaning process using the above cleaning gas may be started.

Figure 13:
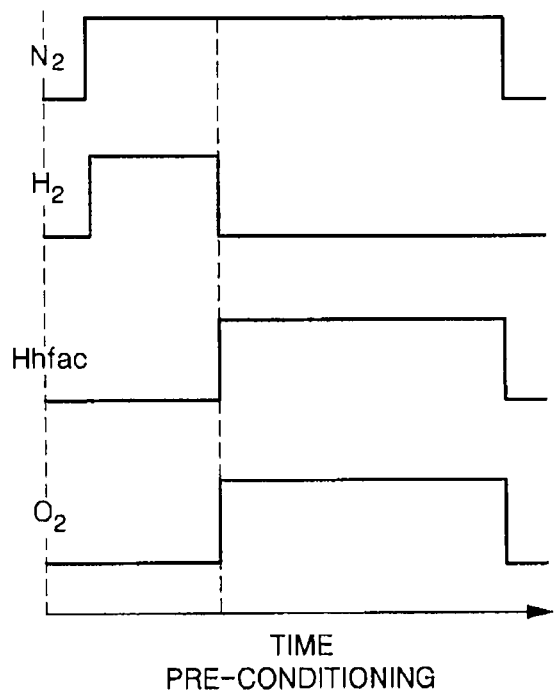
FIG. 13 shows an example of a gas supply process including a reduction process.

FIG. 13 shows an example of gas supply in the case of performing a reduction process as preprocessing (pre-conditioning). In that case, the supply of nitrogen and hydrogen is firstly started. After a predetermined period of time elapses, the supply of hydrogen is stopped, and the supply of hexafluoroacetylacetone and oxygen is started.

Figure 14:
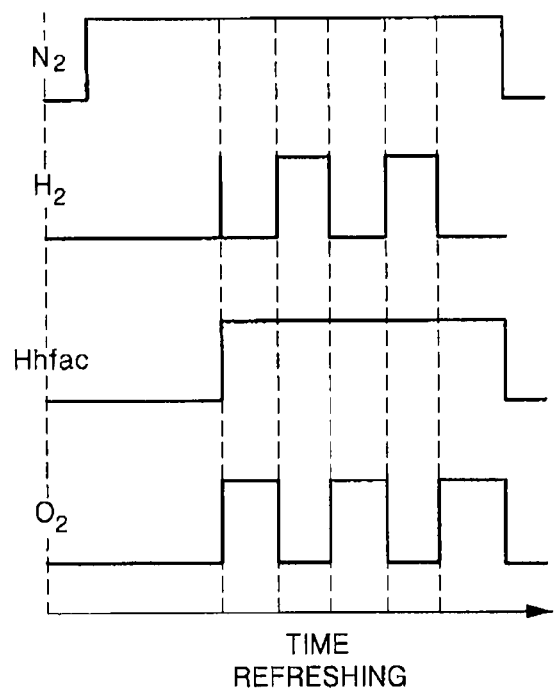
FIG. 14 shows an example of a gas supply process including a reduction process.

FIG. 14 shows the case of refreshing an atmosphere by performing a reduction process during cleaning. In that case, the supply of nitrogen is firstly started. After a predetermined period of time elapses, the supply of hexafluoroacetylacetone and oxygen is started. The supply of oxygen is stopped at a predetermined cycle, and the supply of hydrogen is started while the supply of oxygen is being stopped.

The heating method is not limited to a method for heating the inside of the processing chamber 10 by using a heater provided in the CVD apparatus 100, and may be a method for heating the inside of the processing chamber 10 by supplying a heated gas, e.g., heated nitrogen gas, together with hexafluoroacetylacetone and oxygen.

While the invention has been shown and described with respect to the embodiments, it will be understood by those skilled in the art that various changes and modification may be made without departing from the scope of the invention as defined in the following claims.

What is claimed is:

1. A dry cleaning method of a substrate processing apparatus, comprising:
   cleaning an inside of a processing chamber of the substrate processing apparatus by supplying oxygen and β-diketone into the processing chamber while heating the inside of the processing chamber,
   wherein the cleaning includes
      forming a metal oxide by oxidizing a metal film adhered to the inside of the processing chamber with the supplied oxygen;
      forming a complex by reacting the metal oxide with the supplied β-diketone; and
      sublimating the complex,
      wherein ratio of a flow rate of the supplied oxygen to a flow rate of the supplied β-diketone is set such that a formation rate of the metal oxide is lower than a formation rate of the complex.

2. The dry cleaning method of claim 1, wherein the flow rate of the supplied oxygen is gradually increased.

3. The dry cleaning method of claim 1, wherein the processing chamber is heated by supplying a heated gas into the processing chamber.

4. The dry cleaning method of claim 1, further comprising supplying a reduction gas or a plasma into the processing chamber.

5. A dry cleaning method of a substrate processing apparatus, comprising:
   cleaning an inside of a processing chamber of the substrate processing apparatus by supplying oxygen and β-diketone into the processing chamber while heating the inside of the processing chamber,
   wherein the cleaning includes
      forming a nickel oxide by oxidizing a nickel film adhered to the inside of the processing chamber with the supplied oxygen;
      forming a complex by reacting the nickel oxide with the supplied β-diketone; and
      sublimating the complex,
      wherein ratio of a flow rate of the supplied oxygen to a flow rate of the supplied β-diketone is set such that a formation rate of the nickel oxide is lower than a formation rate of the complex.

6. The dry cleaning method of claim 5, wherein the β-diketone is hexafluoroacetylacetone.

7. The dry cleaning method of claim 5, wherein the flow rate of the supplied oxygen is gradually increased.

8. The dry cleaning method of claim 5, wherein the processing chamber is heated by supplying a heated gas into the processing chamber.

9. The dry cleaning method of claim 5, further comprising supplying a reduction gas or a plasma into the processing chamber.

10. The dry cleaning method of claim 6, wherein the ratio ranges from about 0.01 to about 0.05, and a heating temperature T in the processing chamber ranges from about 250° C. to about 325° C.

11. The dry cleaning method of claim 6, wherein a heating temperature T of the processing chamber and a ratio $P(O_2)/P(Hhfac)$ of a partial pressure ($P(O_2)$) of the supplied oxygen to a partial pressure ($P(Hhfac)$) of the hexafluoroacetylacetone satisfies a relationship expressed by $P(O_2)/P(Hhfac) \leq 1.5 \times 4.329 \times 10^{-17} \times T^{5997}$.

12. The dry cleaning method of claim 10, wherein the heating temperature T and a ratio $P(O_2)/P(Hhfac)$ of a partial pressure ($P(O_2)$) of the supplied oxygen to a partial pressure ($P(Hhfac)$) of the hexafluoroacetylacetone satisfies a relationship expressed by $P(O_2)/P(Hhfac) \leq 1.5 \times 4.329 \times 10^{-17} \times T^{5.997}$.

13. A metal film removing method comprising:
removing a metal film from inside a processing chamber by supplying a heated mixture comprising oxygen and β-diketone to the metal film;
wherein said removing the metal film includes
forming a metal oxide by oxidizing the metal film with the supplied oxygen;
forming a complex by reacting the metal oxide with the supplied β-diketone;
sublimating the complex;
exhausting the sublimated complex from the processing chamber,
wherein a ratio of a flow rate of the supplied oxygen to a flow rate of the supplied β-diketone is set such that a formation rate of the metal oxide is lower than a formation rate of the complex.

14. The metal film removing method of claim 13, wherein the metal film is a nickel film.

15. The metal film removing method of claim 13, wherein the flow rate of the supplied oxygen is gradually increased.

16. The metal film removing method of claim 14, wherein the β-diketone is hexafluoroacetylacetone.

17. The metal film removing method of claim 14, wherein the flow rate of the supplied oxygen is gradually increased.

18. The metal film removing method of claim 16, wherein the ratio ranges from about 0.01 to about 0.05, and further comprising heating the metal film in the processing chamber to a temperature T in a range from about 250° C. to about 325° C.

19. The metal film removing method of claim 18, wherein the heating temperature T and a ratio $P(O_2)/P(Hhfac)$ of a partial pressure ($P(O_2)$) of the supplied oxygen to a partial pressure ($P(Hhfac)$) of the hexafluoroacetylacetone satisfies a relationship expressed by $P(O_2)/P(Hhfac) \leq 5 \times 4.329 \times 10^{-17} \times T^{5.997}$.

* * * * *